United States Patent
Zhang

(10) Patent No.: US 11,803,319 B2
(45) Date of Patent: Oct. 31, 2023

(54) WRITE OPERATION CIRCUIT, SEMICONDUCTOR MEMORY AND WRITE OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 371 days.

(21) Appl. No.: 17/242,281

(22) Filed: Apr. 27, 2021

(65) Prior Publication Data
US 2021/0247927 A1    Aug. 12, 2021

Related U.S. Application Data

(63) Continuation of application No. PCT/CN2020/097409, filed on Jun. 22, 2020.

(30) Foreign Application Priority Data

Oct. 25, 2019 (CN) .......................... 201911021458.4

(51) Int. Cl.
*G06F 3/06* (2006.01)
*G11C 11/4076* (2006.01)
(Continued)

(52) U.S. Cl.
CPC .......... *G06F 3/0655* (2013.01); *G06F 3/0604* (2013.01); *G06F 3/0679* (2013.01);
(Continued)

(58) Field of Classification Search
CPC ............ G11C 7/1006; G11C 2207/107; G11C 11/4096; G11C 11/4093; G11C 11/4076; G06F 3/0604; G06F 3/0655; G06F 3/0679
(Continued)

(56) References Cited

U.S. PATENT DOCUMENTS 5,216,637 A    6/1993  Vaillancourt
6,859,402 B2   2/2005  Campbell et al.
(Continued)

FOREIGN PATENT DOCUMENTS

CN    1702768 A    11/2005
CN   104272389 A    1/2015
(Continued)

OTHER PUBLICATIONS

European Patent Office, Extended European Search Report Issued in Application No. 20879032.9 dated Mar. 11, 2022, Germany, 8 pages.

*Primary Examiner* — Ly D Pham
(74) *Attorney, Agent, or Firm* — KILPATRICK TOWNSEND & STOCKTON LLP

(57) ABSTRACT

Embodiments provide a write operation circuit, a semiconductor memory, and a write operation method. The write operation circuit includes a serial-to-parallel conversion circuit, a data buffer, a DBI decoder, and a precharge module. The serial-to-parallel conversion circuit performs serial-to-parallel conversion on first DBI data of a DBI port to generate second DBI data for transmission via a DBI signal line and generates input data of the data buffer according to the second DBI data and input data of a DQ port. The data buffer determines, according to the input data of the data buffer, whether to invert the global bus. The DBI decoder receives the second DBI data, decodes the global bus data and writes the decoded global bus data into the memory bank, where the decoding comprises determining whether to invert the global bus data. The precharge module sets an initial state of the global bus to Low.

10 Claims, 5 Drawing Sheets

(51) Int. Cl.
*G11C 11/4096* (2006.01)
*G11C 11/4093* (2006.01)
*G11C 7/10* (2006.01)

(52) U.S. Cl.
CPC ........ *G11C 7/1006* (2013.01); *G11C 11/4076* (2013.01); *G11C 11/4093* (2013.01); *G11C 11/4096* (2013.01); *G11C 2207/107* (2013.01)

(58) Field of Classification Search
USPC .................................................. 365/189.011
See application file for complete search history.

(56) References Cited

U.S. PATENT DOCUMENTS

| | | | |
|---|---|---|---|
| 9,432,298 B1* | 8/2016 | Smith | H04L 49/9057 |
| 10,128,842 B1* | 11/2018 | Lin | H03K 19/0005 |
| 10,373,657 B2 | 8/2019 | Kondo et al. | |
| 2002/0159300 A1 | 10/2002 | Fujimoto | |
| 2010/0042889 A1* | 2/2010 | Hargan | G06F 11/1625 |
| | | | 714/752 |
| 2015/0095520 A1 | 4/2015 | Kwack | |
| 2015/0356047 A1 | 12/2015 | Ayyapureddi et al. | |
| 2016/0224480 A1* | 8/2016 | Ku | G06F 13/4204 |
| 2018/0047432 A1* | 2/2018 | Kondo | G11C 5/025 |
| 2018/0293128 A1* | 10/2018 | Dono | G06F 11/1004 |
| 2019/0044764 A1* | 2/2019 | Hollis | G11C 7/1084 |
| 2019/0347223 A1* | 11/2019 | Ho | G06F 3/0673 |

FOREIGN PATENT DOCUMENTS

| | | |
|---|---|---|
| CN | 108630255 A | 10/2018 |
| CN | 109643563 A | 4/2019 |
| CN | 210575117 U | 5/2020 |
| CN | 210667805 U | 6/2020 |

* cited by examiner

WRITE OPERATION CIRCUIT, SEMICONDUCTOR MEMORY AND WRITE OPERATION METHOD

CROSS REFERENCE

This application is a continuation of PCT/CN2020/097409, filed on Jun. 22, 2020, which claims priority to Chinese Patent Application No. 201911021458.4, titled "WRITE OPERATION CIRCUIT, SEMICONDUCTOR MEMORY AND WRITE OPERATION METHOD" and filed to the State Intellectual Property Office on Oct. 25, 2019, the entire contents of which are incorporated herein by reference.

TECHNICAL FIELD

The present disclosure relates to the field of semiconductor memory technologies, and more particularly, to a write operation circuit, a semiconductor memory, and a write operation method.

BACKGROUND

A semiconductor memory includes a static random-access memory (SRAM), a dynamic random access memory (DRAM), a synchronous dynamic random access memory (SDRAM), a read-only memory (ROM), and a flash memory, etc.

In the DRAM protocol made by Joint Electron Device Engineering Council (JEDEC), there are specific requirements for DRAM's speed and power saving. How to make DRAM more power-saving while also ensuring the signal integrity and the reliability of data transmission and storage is a problem urgently to be solved in the industry.

SUMMARY

Embodiments of the present disclosure provide a write operation circuit, a semiconductor memory and a write operation method to solve or alleviate one or more problems in the existing art.

In one aspect, embodiments of the present disclosure provide a write operation circuit that is used in a semiconductor memory. The semiconductor comprising a Data Queue (DQ) port, a data bus inversion (DBI) port and a memory bank. The write operation circuit comprising: a serial-to-parallel conversion circuit, a data buffer, a DBI decoder, and a precharge module; wherein The serial-to-parallel conversion circuit is connected to the DBI port and the DQ port. The serial-to-parallel conversion circuit is configured to perform serial-to-parallel conversion on first DBI data of the DBI port to generate second DBI data for transmission through a DBI signal line, and generate input data of the data buffer according to the second DBI data and input data of the DQ port.

The data buffer includes a plurality of PMOS transistors. A gate electrode of each of the plurality of PMOS transistors is connected to the serial-to-parallel conversion circuit to receive the input data of the data buffer. A drain electrode of each of the plurality of PMOS transistors is connected to a global bus. The data buffer is configured to determine, according to the input data of the data buffer, whether to invert the global bus.

The DBI decoder is connected to the memory bank, receives global bus data on the global bus, receives the second DBI data through the DBI signal line. The DBI decoder is configured to decode the global bus data according to the second DBI data and write the decoded data into the memory bank, where the decoding includes determining whether to invert the global bus data.

The precharge module is connected to a precharge signal line and is configured to set an initial state of the global bus to Low.

In some embodiments, when a number of high-level bits of external data is greater than a preset value, the first DBI data is set to High, and the input data of the DQ port is the inversion data of the external data; when the number of the high-level bits of the external data is less than or equal to the preset value, the first DBI data is set to Low, and the input data of the DQ port is the external data. The serial-to-parallel conversion circuit is configured to perform serial-to-parallel conversion on the input data of the DQ port to generate converted data; and the serial-to-parallel conversion circuit is further configured to invert the converted data to generate the input data of the data buffer when the second DBI data is high, and use the converted data as the input data of the data buffer when the second DBI data is low.

In some embodiments, the serial-to-parallel conversion circuit is configured to perform serial-to-parallel conversion on 1-bit first DBI data to generate M-bit second DBI data, the global bus data is divided into M groups, the M bits of the second DBI data are in one-to-one correspondence with the M groups of the global bus data, the DBI decoder includes M DBI subdecoders, each of the M DBI subdecoders is connected to the memory bank and configured to decode the corresponding group of the global bus data according to one corresponding bit of the second DBI data, where M is an integer greater than 1.

In some embodiments, the DBI subdecoder comprises: a first inverter and a decoding unit; wherein An input terminal of the first inverter is connected to the DBI signal line.

An input terminal of the decoding unit is connected to the global bus, an output terminal of the decoding unit is connected to the memory bank, and the decoding unit is configured to output the inversion data of the global bus data when the second DBI data is high and output the original global bus data when the second DBI data is low.

In some embodiments, the decoding unit comprises: a second inverter, a first logic AND gate, a second logic AND gate, and a logic NOR gate; wherein An input terminal of the second inverter is connected to the global bus.

Two input terminals of the first logic AND gate are respectively connected to an output terminal of the first inverter and an output terminal of the second inverter.

Two input terminals of the second logic AND gate are respectively connected to the DBI signal line and the global bus.

Two input terminals of the logic NOR gate are respectively connected to an output terminal of the first logic AND gate and an output terminal of the second logic AND gate, and an output terminal of the logic NOR gate is connected to the memory bank.

In some embodiments, the precharge module comprises a plurality of NMOS transistors and a plurality of hold circuits, a gate electrode of each of the plurality of NMOS transistors is connected to the precharge signal line, a drain electrode of each of the plurality of NMOS transistors is connected to the global bus, and an input terminal and an output terminal of each of the plurality of hold circuits are both connected to the global bus.

In another aspect, embodiments of the present disclosure provide a semiconductor memory. The semiconductor memory comprising: a DQ port, a DBI port, a memory bank, and the write operation circuit according to any one of the above embodiments.

In yet another aspect, embodiments of the present disclosure provide a write operation method. The method is applied to a semiconductor memory, and the semiconductor memory comprising a DQ port, a DBI port, and a memory bank. The method comprising:

setting an initial state of a global bus to Low;
performing serial-to-parallel conversion on first DBI data of the DBI port to generate second DBI data;
generating input data of a data buffer according to the second DBI data and input data of the DQ port;
determining, according to the input data of the data buffer, whether to invert the global bus;
decoding global bus data on the global bus according to the second DBI data, where the decoding includes determining whether to invert the global bus data; and
writing the decoded data into the memory bank.

In some embodiments, the generating the input data of the data buffer according to the second DBI data and the input data of the DQ port comprises:

performing serial-to-parallel conversion on the input data of the DQ port to generate converted data;
when the second DBI data is high, inverting the converted data to generate the input data of the data buffer; and
when the second DBI is low, using the converted data as the input data of the data buffer.

In some embodiments, the decoding the global bus data on the global bus according to the second DBI data comprises:

performing serial-to-parallel conversion on 1-bit first DBI data of the DBI port to generate M-bit second DBI data, where M is an integer greater than 1;
dividing the global bus data into M groups; and
decoding each of the M groups of the global bus data according to the corresponding one bit of the second DBI data.

By using the above technical solutions, the embodiments of the present disclosure can reduce the number of inversions of the global bus in a Precharge-Low architecture, thereby greatly reducing a current and decreasing power consumption.

The above is only for the purpose of description and is not intended to be limiting in any way. In addition to the illustrative aspects, embodiments and features described above, further aspects, embodiments and features of this disclosure can be easily understood by referring to the drawings and the following detailed description.

BRIEF DESCRIPTION OF THE DRAWINGS

In the drawings, unless otherwise specified, the same reference numerals denote the same or similar parts or elements throughout the multiple drawings. The drawings are not necessarily drawn to scale. It should be understood that these drawings only depict some embodiments disclosed according to the present disclosure, and should not be regarded as limiting of the scope of the present disclosure.

REFERENCE NUMERALS IN THE ACCOMPANYING DRAWINGS

Figure 1:
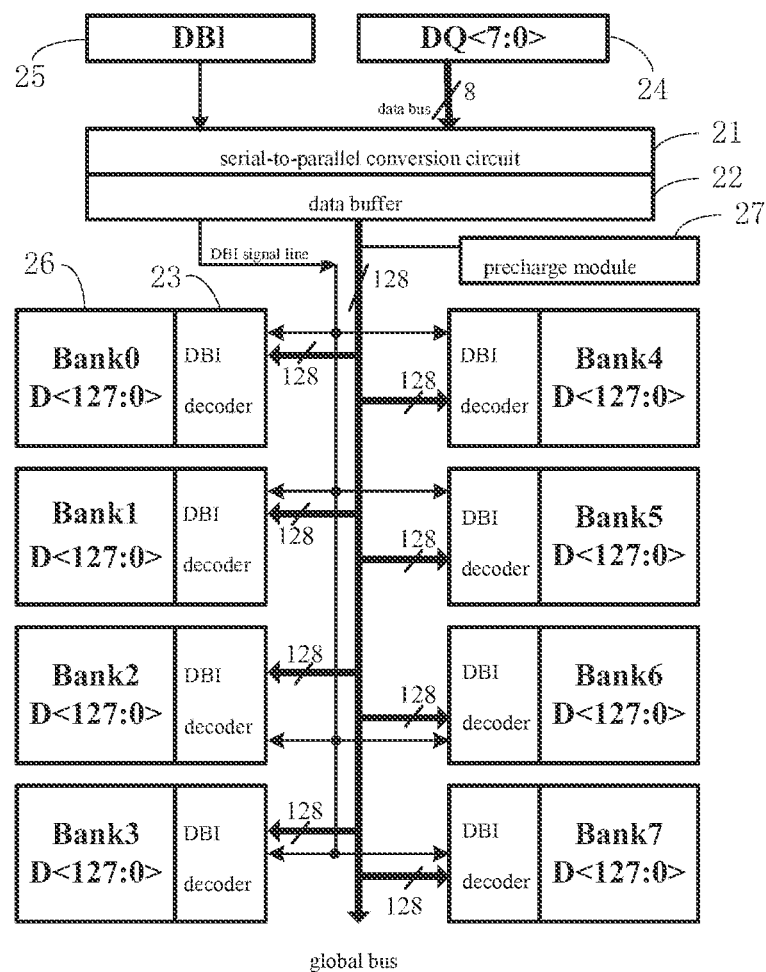
FIG. 1 shows a schematic block diagram of a part of a semiconductor memory according to an implementation of an embodiment of the present disclosure.

10: controller;
20: semiconductor memory;
21: serial-to-parallel conversion circuit;
22: data buffer;
23: DBI decoder;
24: DQ port;
25: DBI port;
26: memory bank;
27: precharge module;
221: PMOS transistor;
222: NMOS transistor;
223: hold circuit;
230: DBI subdecoder;
231: first inverter;
232: decoding unit;
232A: second invertor;
232B: first logic AND gate;
232C: second logic AND gate; and
232D: logic NOR gate.

DETAILED DESCRIPTION

Exemplary embodiments will be described more comprehensively with reference to the accompanying drawings. However, the exemplary embodiments can be implemented in various forms, and should not be construed as being limited to the embodiments set forth herein. On the contrary, these embodiments are provided so that this disclosure will be comprehensive and complete, and will fully convey the concept of the exemplary embodiments to those skilled in the art. In the drawings, the same reference numerals denote the same or similar elements, and thus their repeated description will be omitted.

FIG. 1 shows a schematic block diagram of a part of a semiconductor memory according to an implementation of an embodiment of the present disclosure. As shown in FIG. 1, a semiconductor memory 20 includes a DQ port 24, a Data Bus Inversion (DBI) port 25, a memory bank 26, and a write operation circuit. The write operation circuit includes a global bus, a DBI signal line, a serial-to-parallel conversion circuit 21, a data buffer 22, a DBI decoder 23, and a precharge module 27. In an implementation, the semiconductor memory is Dynamic Random Access Memory (DRAM), for example, Double Data Rate SDRAM 4 (abbreviated as DDR4).

In an example, as shown in FIG. 1, the write operation circuit receives 8-bit input data DQ<7:0> through the DQ port 24, and writes write data D<127:0> into the memory bank 26. One Active command enables the only one designated memory bank 26. The write operation is executed on only one memory bank 26. That is, when one memory bank of eight memory banks 26 (i.e. Bank<7:0>) is working, the other memory banks are not working. It should be noted that, the number of the memory banks 26, the number of data bits of each memory bank 26, the number of data bits of the DQ port 24, and the number of the DQ port 24 are not limited in embodiments of the present disclosure. For example, there may be one DQ port 24 for inputting 8-bit input data. For another example, there may be two DQ ports 24, which are respectively used for inputting 8-bit input data DQ<7:0> and inputting 8-bit input data DQ<15:8>, and thus 16-bit input data DQ<15:0> is inputted.

Figure 2:
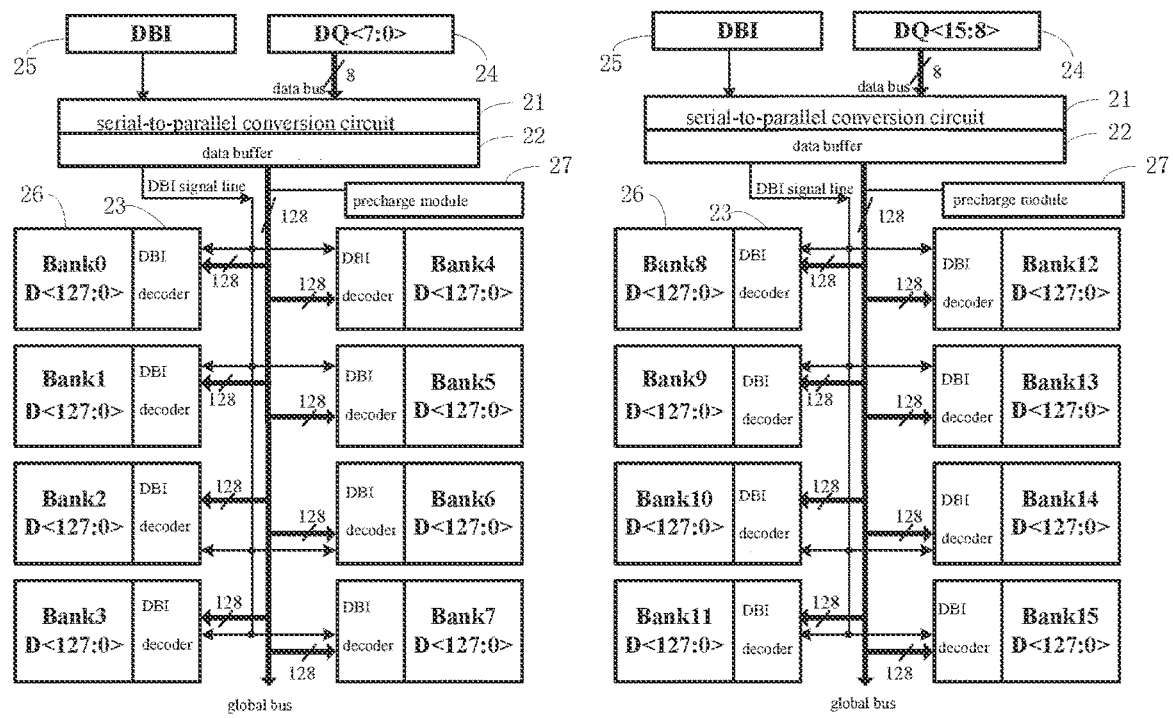
FIG. 2 shows a schematic block diagram of a part of a semiconductor memory according to another implementation of the embodiment of the present disclosure.

In another example, as shown in FIG. 2, in the 16-bit input data DQ<15:0> inputted through the DQ ports 24, the write operation of the input data DQ<7:0> for a group of memory banks <7:0> is executed by one write operation circuit, and the write operation of the input data DQ<15:8> for another group of memory banks <15:8> is executed by another write operation circuit. Accordingly, among the eight memory banks 26 (i.e. Bank<15:8>) corresponding to DQ<15:8>, when one memory bank is working, the other memory banks are not working.

Figure 3:
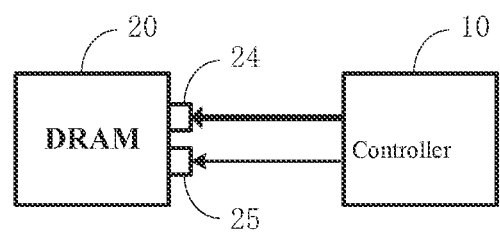
FIG. 3 shows a schematic diagram of the DBI function.

The function of the DBI port 25 is described below with reference to FIG. 3. An On-Die Termination (ODT) resistor of the semiconductor memory 20 can absorb a current of the DQ port 24 through a ground pin to prevent a signal reflection in an internal circuit of the semiconductor memory 20. During the working process of the semiconductor memory 20, the resistance value of the ODT resistor is adjusted to match the controller 10. In an embodiment, the ODT resistor is in a pull-down configuration. When the data of the DQ port 24 is "1", the leakage current passing through the ODT resistor is large, which increases the power consumption. Therefore, when the number of high-level bits in external data is greater than a preset value, the first DBI data of the DBI port 25 is set to High, and the external data is inverted to obtain the input data of the DQ port. When the number of high-level bits in external data is less than or equal to the preset value, the first DBI data is set to Low, and the input data of the DQ port is the external data.

For example, if the number of bits "1" in the external data inputted into the DQ port 24 is large, each bit of the external data is inverted and then inputted into the semiconductor memory 20, and the first DBI data of the DBI port is set to High for indicating that the input data is the inversion data of the external data. For example, if the input data DQ<7:0> is <00000000> and the first DBI data is 0, it indicates that the input data DQ<7:0> is the original external data, that is, the external data is also <00000000>. If the input data DQ<7:0> is <00000000> and the first DBI data is 1, it indicates that the input data DQ<7:0> is the inversion data of the external data, that is, the external data is <11111111>. The input data DQ<15:8> of the DQ port 24 is processed in the same manner. Therefore, in the input data DQ<15:0> of the DQ port 24, there are more bits "0", thereby reducing the power consumption.

The data being high means the data is "1", and the data being low means the data is "0". The data inversion means "0" is flipped to "1" or "1" is flipped to "0". The inversion of a data line or a signal line can be understood as a high level changing to a low level, or a low level changing to a high level.

The semiconductor memory 20 is in an array structure, and the structure of each unit may be the same. However, the output data of the units may be different due to different input data. The write operation circuit of the present embodiment is described below by taking one memory bank as an example.

As shown in FIG. 1, the serial-to-parallel conversion circuit 21 is connected to the DBI port 25 and is configured to perform serial-to-parallel conversion on first DBI data of the DBI port 25 to generate second DBI data for transmission through the DBI signal line. The serial-to-parallel conversion circuit 21 is connected to the DQ port 24 and is configured to generate the input data of the data buffer 22 according to the second DBI data and the input data DQ of the DQ port.

In an implementation, the serial-to-parallel conversion circuit 21 is configured to perform serial-to-parallel conversion on the input data of the DQ port 24 to generate the converted data, and determine, according to the second DBI data, whether to invert the converted data to generate the input data of the data buffer.

For example, the serial-to-parallel conversion circuit 21 performs serial-to-parallel conversion on the inputted 8-bit input data DQ<7:0> and generates 128-bit converted data, and then determines, according to the 16-bit second DBI data<15:0>, whether to invert the converted data, and outputs 128-bit input data D2'<127:0> to the data buffer 22.

In an example, the 128-bit converted data is divided into 16 groups, and each group of converted data has 8 bits, one bit of the second DBI data corresponds to one 8-bit group of converted data, and accordingly, one 8-bit group of input data D2' can be generated.

It should be noted that the serial-to-parallel conversion circuit 21 may include two serial-to-parallel conversion modules, and the two serial-to-parallel conversion modules are respectively used for the serial-to-parallel conversion of the input data of the DQ port 24 and the serial-to-parallel conversion of the first DBI data, which is not limited in the present disclosure.

The precharge module 27 is connected to the precharge signal line Precharge, and is configured to set an initial state of the global bus to Low. That is, the global bus of the semiconductor memory 20 adopts a Precharge-Low transmission configuration.

Figure 4:
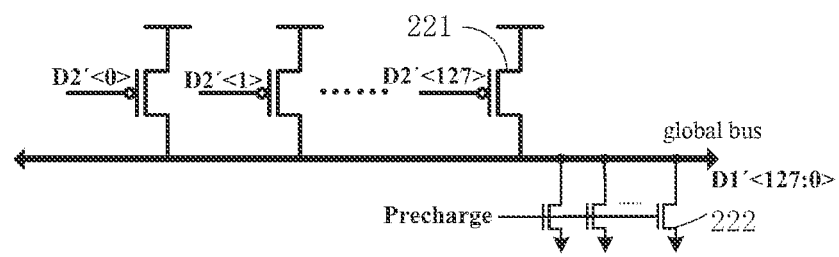
FIG. 4 shows a schematic circuit diagram of a data buffer and a precharge module (corresponding to one memory bank) according to an implementation of the embodiment of the present disclosure.
Figure 5:
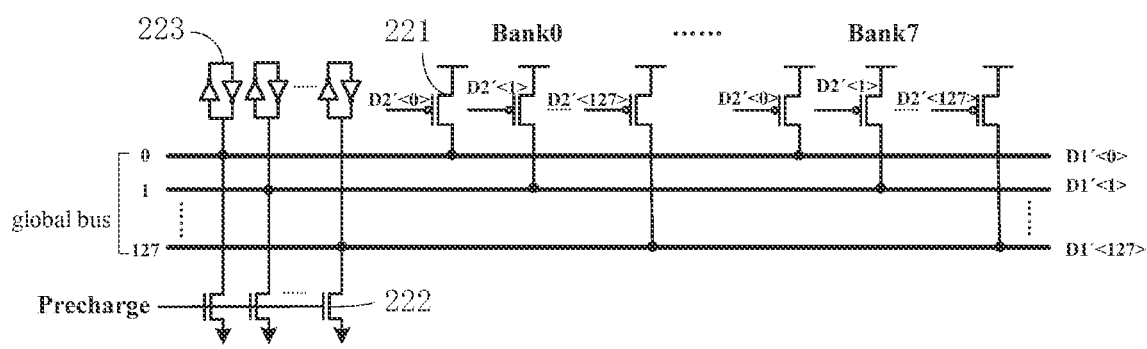
FIG. 5 shows a schematic circuit diagram of a data buffer and a precharge module (corresponding to multiple memory banks) according to an implementation of the embodiment of the present disclosure.

FIG. 4 shows a schematic circuit diagram of a data buffer 22 (corresponding to one memory bank 26) according to an implementation of the present embodiment. FIG. 5 shows a schematic circuit diagram of a data buffer 22 (corresponding to 8 memory banks 26) according to an implementation of the present embodiment.

As shown in FIG. 4 and FIG. 5, the data buffer 22 includes a plurality of Positive Channel Metal Oxide Semiconductor (PMOS) transistors 221, and the precharge module 27 includes a plurality of Negative Channel Metal Oxide Semiconductor (NMOS) transistors 222 and a plurality of hold circuits 223. A gate electrode of the PMOS transistor 221 is connected to the serial-to-parallel conversion circuit 21 to receive the input data of the data buffer 22, and a drain electrode of the PMOS transistor 221 is connected to the global bus, such that the data buffer 22 determines, according to the input data of the data buffer 22, whether to invert the global bus. A gate electrode of the NMOS transistor 222 is connected to the precharge signal line, and a drain electrode of the NMOS transistor 222 is connected to the global bus. An input terminal and an output terminal of the hold circuit 223 are both connected to the global bus, thereby forming a positive feedback circuit.

The function of Precharge is to set the initial state of each global bus to Low, and the specific process is as follows. A pull-down pulse (about 2 ns) is generated on the precharge signal line Precharge and pulls down the potential of the corresponding global bus for a moment, the hold circuit 223 forms a positive feedback, and the potential of the global bus is locked to the low level. However, the hold circuit 223 has a poor current pull-up capability and a poor current pull-down capability. When it needs to change the potential of a certain global bus to high level, the potential of the data line (the data line connected to the gate electrode of the corresponding PMOS transistor 221) corresponding to this global bus is pulled down (that is, a pulse, about 2 ns, is applied), and accordingly, the corresponding PMOS transistor 221 pulls up the potential of this global bus for a moment (the pull-up capability is stronger than the pull-down capability of the hold circuit 223), and then the potential of this global bus is locked to the high level through positive feedback, thereby achieving the inversion operation of the data line.

Since the number of data "1" in the input data D2'<127:0> of the data buffer 22 (that is, data on the data lines connected to the gate electrodes of the PMOS transistors 221) is relatively large, the number of the global buses which need to be inverted is relatively small, and the data "0" in the global bus data D1'<127:0> is relatively large. Therefore, a write current IDD4W of the semiconductor memory is reduced, and thus the power consumption of the semiconductor is reduced. That is, if there are more data "0" in the global bus data, the write current IDD4W can be reduced, and thus the power consumption can be reduced.

Since the number of data "0" in the input data DQ<7:0> of the DQ port 24 is relatively large and the input data DQ<7:0> is not decoded yet, the number of data "0" in the 128-bit global bus data D1'<127:0> is relatively large. Accordingly, in the semiconductor memory 20 shown in FIG. 2, the number of data "0" in the input data DQ<15:0> is relatively large and decoding is not performed yet, the number of data "0" in the 256-bit global bus data (including the 128-bit global bus data corresponding to DQ<7:0> and the 128-bit global bus data corresponding to DQ<15:8>) is relatively large.

Further, the DBI decoder 23 is connected to the memory bank 26, receives the second DBI data through the DBI signal line, and receives the global bus data through the global bus. The DBI decoder 23 is configured to decode the global bus data according to the second DBI data and write the decoded data into the memory bank 26, where the decoding includes determining whether to invert the global bus data. The decoded data is the write data, for example, D<127:0>. That is, before data is written into the memory bank 26, there are more data "0" transmitted on the global buses.

In the related art, in the case where the DBI function is enabled, when the semiconductor memory performs the write operation and the input data is just received by the semiconductor memory, the semiconductor memory decodes the input data according to the state of the DBI port. If the state of the DBI port is "1", all bits of the input data are subject to a negation operation (are flipped). If the state of the DBI port is "0", none of the bits of the input data is flipped, that is all bits of the input data maintain the original value. The decoder is located at a position where the input data just enters the semiconductor memory, that is, located before the serial-to-parallel conversion circuit. Therefore, in the related art, the number of data "1" transmitted on the global bus inside the semiconductor memory is relatively large, causing a large write current IDD4W and a large power consumption.

In an implementation, the first DBI data has only 1 bit, and the serial-to-parallel conversion circuit 21 is configured to perform serial-to-parallel conversion one the 1-bit first DBI data to generate M-bit second DBI data. For example, the serial-to-parallel conversion circuit 21 can perform serial-to-parallel conversion on 1-bit data of the DBI port 25 to generate 16-bit second DBI data<15:0>.

Figure 6:
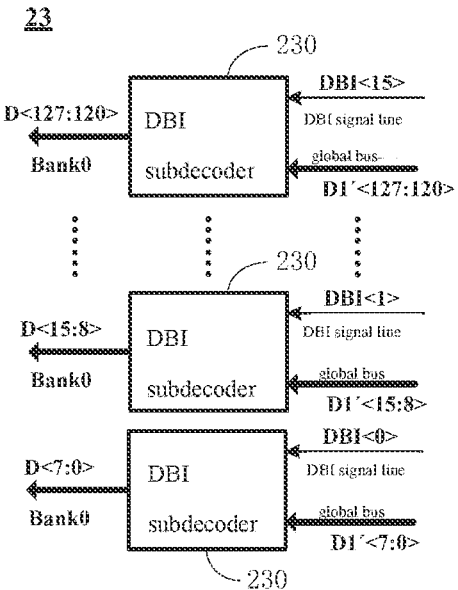
FIG. 6 shows a schematic block diagram of a DBI decoder according to an implementation of the embodiment of the present disclosure.

The global bus data is divided into M groups, and the M bits of the second DBI are in one-to-one correspondence with the M groups of global bus data. As shown in FIG. 6, the DBI decoder 23 includes M DBI subdecoders 230, and each DBI subdecoder 230 is connected to a corresponding memory bank 26. Each DBI subdecoder 230 is configured to decode the corresponding group of global bus data according to one bit of the second DBI data. M is an integer greater than 1.

The DBI decoder 23 outputs the inversion data of the global bus data when the second DBI data is high, and outputs the original global bus data when the second DBI data is low.

For example, the global bus data D1'<127:0> is divided into 16 groups, and each group of global bus data has 8 bits. Accordingly, the second DBI data has 16 bits, for example, DBI<15:0>. Each group of global bus data corresponds to one bit of the DBI data. Therefore, when DBI<15>=1, the decoded data outputted by the DBI decoder 23, that is, the write data D<127:120> written into the memory bank 26 (for example Bank 0), is the inversion data of the global bus data D1'<127:120>; when DBI<15>=0, the write data D<127:120> is the global bus data D1'<127:120>. Similarly, when DBI<1>=1, the write data D<15:8> is the inversion data of the global bus data D1'<15:8>; when DBI<1>=0, the write data D<15:8> is the global bus data D1'<15:8>; when DBI<0>=1, the write data D<7:0> is the inversion data of the global bus data D1'<7:0>; and when DBI<0>=0, the write data D<7:0> is the global bus data D1'<7:0>.

In an example, there are a plurality of global buses, the plurality of global buses are arranged into M groups, where M is an integer greater than 1, and each global bus transmits one bit of global bus data. For example, there are 128 global buses, and the 128 global buses are arranged into 16 groups. The global bus <0> transmits the global bus data D1'<0>; the global bus <1> transmits the global bus data D1'<1>; . . . ; the global bus <127> transmits the global bus data D1'<127>.

In an example, there are 16 DBI signal lines, and each DBI signal line transmits one bit of the second DBI data. For example, the DBI signal line <0> transmits the second DBI data DBI<0>, which is used for indicating whether the write data D<7:0> is the inversion data of the global bus data D1'<7:0>; the DBI signal line <1> transmits the second DBI data DBI<1>, which is used for indicating whether the write data D<15:8> is the inversion data of the global bus data D1'<15:8>; . . . ; the DBI signal line <15> transmits the second DBI data DBI<15>, which is used for indicating whether the write data D<127:120> is the inversion data of the global bus data D1'<127:120>.

According to the semiconductor memory 20 of the present embodiment, when the data inputted through DQ<7:0> for the first time is <00000000> and the first DBI data is 0, and the data inputted through DQ<7:0> for the second time is <00000000> and the first DBI data is 1, each corresponding group (8 bits) of global bus data will always be <00000000> before being written to the memory bank 26, and only one corresponding bit of the second DBI data is 1. Therefore, in the present embodiment, when the global data bus has 256 bits (including the 128-bit global bus data corresponding to the DQ<7:0> and the 128-bit global bus data corresponding to the DQ<15:8>), if it needs to invert the 256-bit global bus data, it becomes that only 32 bits of the second DBI data are inverted, and thus the IDD4W current is greatly reduced.

Figure 7:
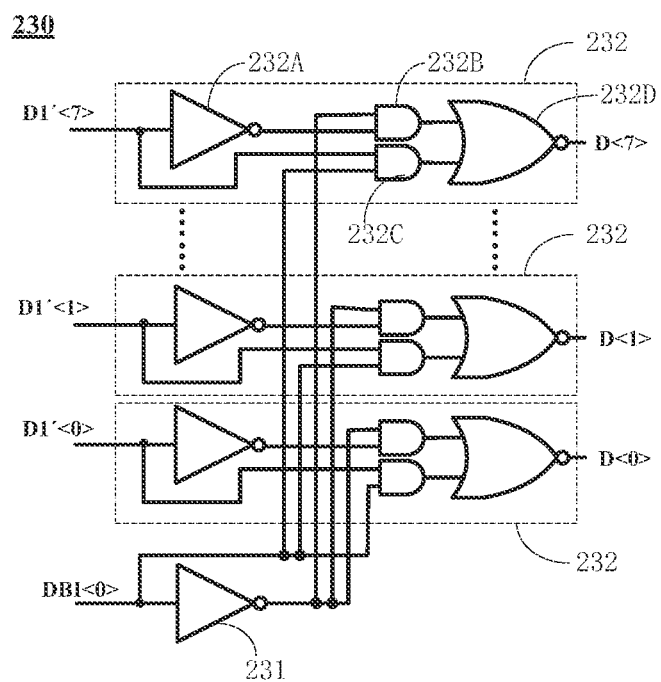
FIG. 7 shows a schematic block diagram of a DBI subdecoder according to an implementation of the embodiment of the present disclosure.

In an implementation, as shown in FIG. 7, the DBI subdecoder 230 may include a first inverter 231 and a decoding unit 232. An input terminal of the first inverter 231 is connected to the DBI signal line. An input terminal of the decoding unit 232 is connected to the global bus, and an output terminal of the decoding unit 232 is connected to the memory bank 26. The decoding unit 232 is configured to output the inversion data of the global bus data when the second DBI data is high, and output the original global bus data when the second DBI data is low.

In an implementation, the decoding unit 232 includes a second inverter 232A, a first logic AND gate 232B, a second logic AND gate 232C, and a logic NOR gate 232D. An input terminal of the second inverter 232A is connected to the global bus. Two input terminals of the first logic AND gate 232B are respectively connected to an output terminal of the first inverter 231 and an output terminal of the second inverter 232A. Two input terminals of the second logic AND gate 232C are respectively connected to the DBI signal line and the global bus. Two input terminals of the logic NOR gate 232D are respectively connected to an output terminal of the first logic AND gate 232B and an output terminal of the second logic AND gate 232C, and an output terminal of the logic NOR gate 232D is connected to the memory bank 26.

As shown in FIG. 7, the decoding unit 232 corresponding to the DBI<0>, the write data D<7:0>, and the global bus data D1'<7:0> is taken as an example, when DBI<0>=1, D<7> is equal to the inversion data of D1'<7>, . . . , D<1> is equal to the inversion data of D1"<1>, D<0> is equal to the inversion data of D1'<0>; when DBI<0>=0, D<7> is equal to D1'<7>, . . . , D<1> is equal to D1'<1>, D<0> is equal to D1'<0>.

It should be noted that each DBI subdecoder 230 is the same. However, because the inputted data is different, data outputted by each DBI subdecoder may be different. FIG. 7 shows the structure of one DBI subdecoder 230, the data inputted into this DBI subdecoder is D1'<7:0> and DBI<0>, and the outputted data is D<7:0>. In addition, the present embodiment does not limit the implementation circuit of the DBI subdecoder 230, as long as the DBI subdecoder can output the inversion data of the global bus data when the second DBI data is 1, and output the global bus data when the second DBI data is 0.

In practical applications, the semiconductor memory 20 of the present embodiment further includes other structures such as a sense amplifier and a precharge circuit, which are not repeated in this embodiment because they belong to the existing technologies.

Figure 8:
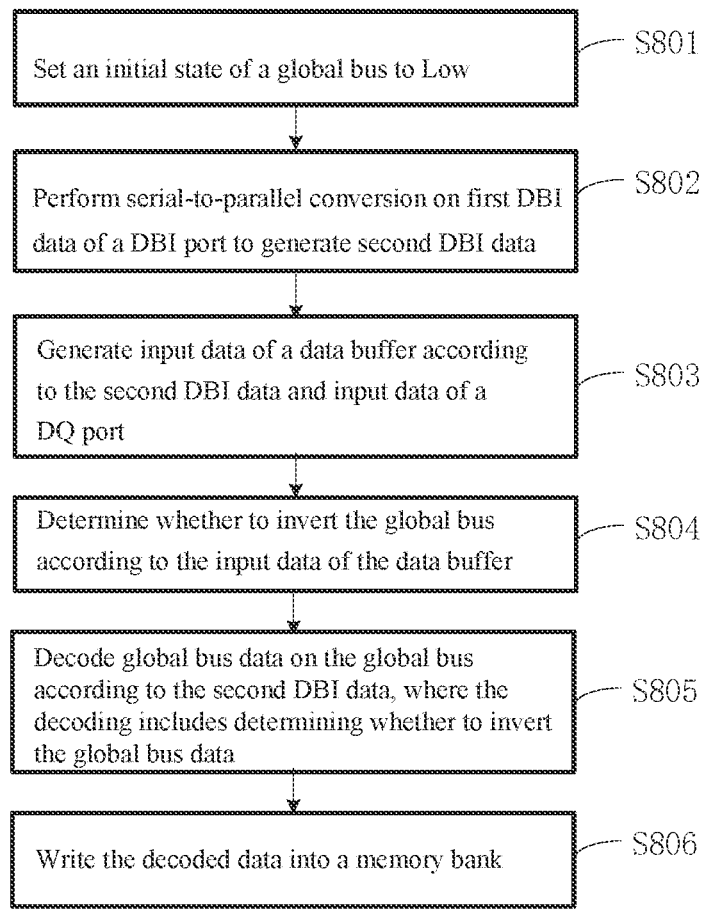
FIG. 8 shows a schematic flowchart of a write operation method according to an implementation of the embodiment of the present disclosure.

FIG. 8 shows a schematic flowchart of a write operation method according to an implementation of the present embodiment. The write operation method can be applied in the above semiconductor memory 20. As shown in FIG. 8, the write operation method includes the following steps.

In step S801, an initial state of the global bus is set to Low.

In step S802, serial-to-parallel conversion is performed on the first DBI data of the DBI port to generate second DBI data.

In step S803, input data of a data buffer is generated according to the second DBI data and input data of the DQ port.

In step S804, whether to invert the global bus is determined according to the input data of the data buffer.

In step S805, the global bus data on the global bus is decoded according to the second DBI data, where the decoding includes determining whether to invert the global bus data.

In step S806, the decoded data is written into the memory bank.

In an implementation, the step S803 may include: performing serial-to-parallel conversion on the input data of the DQ port to generate converted data; when the second DBI data is high, inverting the converted data to generate the input data of the data buffer; and when the second DBI is low, using the converted data as the input data of the data buffer.

In an implementation, the step S805 may include: performing serial-to-parallel conversion on 1-bit first DBI data of the DBI port to generate M-bit second DBI data, where M is an integer greater than 1; dividing the global bus data into M groups; and decoding each of the M groups of the global bus data according to the corresponding one bit of the second DBI data.

The write operation circuit provided by embodiments of the present disclosure is used in a semiconductor memory whose global bus transmission structure is a Precharge-Low architecture. By arranging the DBI decoder between the serial-to-parallel conversion circuit and the memory bank, data "0" transmitted through the global bus can include more bits "0" before data is written into the memory bank, such that the number of inversions of the internal global bus can be reduced. In this way, the current may be reduced significantly, and power consumption may be decreased.

In the description of this specification, descriptions of reference terms "one embodiment", "some embodiments", "example", "specific example", or "some examples" mean that a particular feature, structure, material, or characteristic described in in conjunction with the embodiment is included in at least one embodiment of the present disclosure. Moreover, the described specific features, structures, materials or characteristics can be combined in any one or more embodiments or examples in a suitable manner. In addition, if there is no conflict with each other, those of ordinary skill in the art can combine different embodiments or examples and combine the features of the different embodiments or examples described in this specification.

Furthermore, the described features, structures or characteristics may be combined in one or more embodiments in any suitable manner. However, those of ordinary skill in the art will understand that the technical solutions of the present disclosure can be practiced without one or more of the specific details, or practiced by using other methods, components, materials, devices, steps, and the like. In other cases, well-known structures, methods, devices, implementations, materials, or operations are not shown or described in detail to avoid obscuring various aspects of the present application.

The terms "first" and "second" are only used for descriptive purposes, and should not be understood as indicating or implying relative importance or implicitly indicating the number of described technical features. Thus, the feature defined with "first" and "second" may explicitly or implicitly include one or more of such features. In the description of the present application, "plurality" refers to two or more than two, unless otherwise specifically defined.

It should be noted that although various steps of the method in this disclosure are described in a specific order in the drawings, it is not required or implied that the steps must be performed in the specific order, or that all the shown steps must be performed to achieve the desired result. Additionally or alternatively, some steps may be omitted, multiple steps may be combined into one step for execution, and/or one step may be divided into multiple steps for execution, etc. The above drawings are merely schematic illustrations of the processing included in the method according to the exemplary embodiments of the present disclosure, and are not intended for limitation. It is easy to understand that the processing shown in the above drawings does not indicate or limit the time sequence of these processing. In addition, it is easy to understand that these processes can be executed synchronously or asynchronously in, for example, multiple modules.

Although the spirit and principle of the present disclosure have been described with reference to specific embodiments, it should be understood that the present disclosure is not limited to the specific embodiments disclosed, and the division of various aspects does not mean that the features in these aspects cannot be combined for benefits, this division is only for the convenience of description. This disclosure is intended to cover various modifications and equivalent arrangements included in the spirit and scope of the appended claims.

The foregoing descriptions are merely specific embodiments of the present disclosure, but are not intended to limit the protection scope of the present disclosure. Any modifications or substitutions easily made by those of ordinary skill in the art in light of the teachings disclosed herein shall fall within the protection scope of the present disclosure. Therefore, the protection scope of the present disclosure shall be subject to the protection scope of the claims.

What is claimed is:

1. A write operation circuit used in a semiconductor memory, the semiconductor memory comprising a Data Queue (DQ) port, a Data Bus Inversion (DBI) port, and a memory bank, the write operation circuit comprising: a serial-to-parallel conversion circuit, a data buffer, a DBI decoder, and a precharge module; wherein the serial-to-parallel conversion circuit is connected to the DBI port and the DQ port, and the serial-to-parallel conversion circuit is configured to perform serial-to-parallel conversion on first DBI data of the DBI port to generate second DBI data for transmission through a DBI signal line and is further configured to generate input data of the data buffer according to the second DBI data and input data of the DQ port;

the data buffer comprises a plurality of PMOS transistors, a gate electrode of each of the plurality of PMOS transistors is connected to the serial-to-parallel conversion circuit to receive the input data of the data buffer, a drain electrode of each of the plurality of PMOS transistors is connected to a global bus, and the data buffer is configured to determine, according to the input data of the data buffer, whether to invert the global bus;

the DBI decoder is connected to the memory bank, receives global bus data on the global bus, receives the second DBI data through the DBI signal line, and is configured to decode the global bus data according to the second DBI data and write the decoded global bus data into the memory bank, wherein the decoding comprises determining whether to invert the global bus data;

the precharge module is connected to a precharge signal line and is configured to set an initial state of the global bus to Low.

2. The write operation circuit according to claim 1, wherein when a number of high-level bits of external data is greater than a preset value, the first DBI data is set to high, and the input data of the DQ port is inversion data of the external data;

when the number of the high-level bits of the external data is less than or equal to the preset value, the first DBI data is set to low, and the input data of the DQ port is the external data;

the serial-to-parallel conversion circuit is configured to perform serial-to-parallel conversion on the input data of the DQ port to generate converted data; and the serial-to-parallel conversion circuit is further configured to invert the converted data to generate the input data of the data buffer when the second DBI data is high, and use the converted data as the input data of the data buffer when the second DBI data is low.

3. The write operation circuit according to claim 1, wherein the serial-to-parallel conversion circuit is configured to perform serial-to-parallel conversion on 1-bit first DBI data to generate M-bit second DBI data;

the global bus data is divided into M groups, the M bits of the second DBI data are in one-to-one correspondence with the M groups of the global bus data;

the DBI decoder comprises M DBI subdecoders, each of the M DBI subdecoders is connected to the memory bank and is configured to decode corresponding group of the global bus data according to one bit of the M-bit second DBI data, where M is an integer greater than 1.

4. The write operation circuit according to claim 3, wherein a DBI subdecoder comprises: a first invertor and a decoding unit; wherein an input terminal of the first invertor is connected to the DBI signal line;

an input terminal of the decoding unit is connected to the global bus, an output terminal of the decoding unit is connected to the memory bank, and the decoding unit is configured to output inversion data of the global bus data when the second DBI data is high and output the original global bus data when the second DBI data is low.

5. The write operation circuit according to claim 4, wherein the decoding unit comprises: a second invertor, a first logic AND gate, a second logic AND gate, and a logic NOR gate; wherein an input terminal of the second invertor is connected to the global bus;

two input terminals of the first logic AND gate are respectively connected to an output terminal of the first invertor and an output terminal of the second invertor;

two input terminals of the second logic AND gate are respectively connected to the DBI signal line and the global bus;

two input terminals of the logic NOR gate are respectively connected to an output terminal of the first logic AND gate and an output terminal of the second logic AND gate, and an output terminal of the logic NOR gate is connected to the memory bank.

6. The write operation circuit according to claim 1, wherein the precharge module comprises a plurality of NMOS transistors and a plurality of hold circuits, a gate electrode of each of the plurality of NMOS transistors is connected to the precharge signal line, a drain electrode of each of the plurality of NMOS transistors is connected to the global bus, and an input terminal and an output terminal of each of the plurality of hold circuits are both connected to the global bus.

7. A semiconductor memory, comprising: a Data Queue (DQ) port, a data bus inversion (DBI) port, a memory bank, and a write operation circuit, wherein the write operation circuit comprises: a serial-to-parallel conversion circuit, a data buffer, a DBI decoder, and a precharge module; wherein
the serial-to-parallel conversion circuit is connected to the DBI port and the DQ port, and the serial-to-parallel conversion circuit is configured to perform serial-to-parallel conversion on first DBI data of the DBI port to generate second DBI data for transmission through a DBI signal line and is further configured to generate input data of the data buffer according to the second DBI data and input data of the DQ port;
the data buffer comprises a plurality of PMOS transistors, a gate electrode of each of the plurality of PMOS transistors is connected to the serial-to-parallel conversion circuit to receive the input data of the data buffer, a drain electrode of each of the plurality of PMOS transistors is connected to a global bus, and the data buffer is configured to determine, according to the input data of the data buffer, whether to invert the global bus;
the DBI decoder is connected to the memory bank, receives global bus data on the global bus, receives the second DBI data through the DBI signal line, and is configured to decode the global bus data according to the second DBI data and write the decoded global bus data into the memory bank, wherein the decoding comprises determining whether to invert the global bus data;
the precharge module is connected to a precharge signal line and is configured to set an initial state of the global bus to Low.

8. A write operation method applied to a semiconductor memory, the semiconductor memory comprising a Data Queue (DQ) port, a Data Bus Inversion (DBI) port, and a memory bank, the write operation method comprising:
setting an initial state of a global bus to Low;
performing serial-to-parallel conversion on first DBI data of the DBI port to generate second DBI data;
generating input data of a data buffer according to the second DBI data and input data of the DQ port;
determining, according to the input data of the data buffer, whether to invert the global bus;
decoding global bus data on the global bus according to the second DBI data, where the decoding comprises determining whether to invert the global bus data; and
writing the decoded global bus data into the memory bank.

9. The write operation method according to claim 8, wherein the generating the input data of the data buffer according to the second DBI data and the input data of the DQ port comprises:
performing serial-to-parallel conversion on the input data of the DQ port to generate converted data;
when the second DBI data is high, inverting the converted data to generate the input data of the data buffer; and
when the second DBI is low, using the converted data as the input data of the data buffer.

10. The write operation method according to claim 8, wherein the decoding the global bus data on the global bus according to the second DBI data comprises:
performing serial-to-parallel conversion on 1-bit first DBI data of the DBI port to generate M-bit second DBI data, where M is an integer greater than 1;
dividing the global bus data into M groups; and
decoding each of the M groups of the global bus data according to the corresponding one bit of the M-bit second DBI data.

* * * * *